United States Patent [19]

Sugawara

[11] Patent Number: 5,532,183
[45] Date of Patent: Jul. 2, 1996

[54] SEMICONDUCTOR DEVICE HAVING HEAVILY DOPED SILICON FILM

[75] Inventor: Shigekazu Sugawara, Kawasaki, Japan

[73] Assignee: Fujitsu Limited, Kawasaki, Japan

[21] Appl. No.: 354,351

[22] Filed: Dec. 12, 1994

[30] Foreign Application Priority Data

Feb. 28, 1994 [JP] Japan .................. 6-029667

[51] Int. Cl.⁶ ....................................... H01L 21/20
[52] U.S. Cl. ............... 437/101; 437/173; 437/174; 437/233
[58] Field of Search ....................... 437/101, 233, 437/173, 174

[56] References Cited

U.S. PATENT DOCUMENTS

| | | | |
|---|---|---|---|
| 4,551,906 | 11/1985 | Ogura et al. ............. | 29/571 |
| 5,372,962 | 12/1994 | Hirota et al. ............. | 437/173 |
| 5,389,570 | 2/1995 | Shiozawa ................. | 437/101 |
| 5,429,979 | 7/1995 | Lee et al. ................ | 437/919 |

OTHER PUBLICATIONS

"Defect evaluation of heavily P–doped Si epitaxial films grown at low temperatures" Jia. et al., in Jap. Jr. Appl. Phys. vol. 32 (5A), 1993, pp. 1884–1888.

"Heavily doped (10 cm) Silicon films grown by PhotoCVD at very low temperatures of 250 C.," by Yamada et al. in Jap. Jr. Appl. Phys. pp. L2284–L2287, vol. 28(12), 1989.

"Effects of substrate crystallinity and dopant on the growth kinetics of platinum silicides" by Takai et al. in Jr. Appl. Phys. vol. 58(11), Dec. 1985, p. 4165.

*Primary Examiner*—Robert Kunemund
*Assistant Examiner*—Ramamohan Roa Paladugu
*Attorney, Agent, or Firm*—Armstrong, Westerman, Hattori, McLeland & Naughton

[57] ABSTRACT

A method of manufacturing a semiconductor device including the steps of depositing a silicon film on an underlying layer while doping phosphorus to a concentration of $7\times10^{20}$ to $2\times10^{21}$ atoms/cm³, and thereafter heating the silicon film. A semiconductor device having a silicon film with a sufficiently low resistivity is provided.

12 Claims, 6 Drawing Sheets

SEMICONDUCTOR DEVICE HAVING HEAVILY DOPED SILICON FILM

BACKGROUND OF THE INVENTION a) Field of the Invention

The present invention relates to a method of manufacturing a semiconductor device, and more particularly to a method of manufacturing a semiconductor device including a step of depositing a silicon film.

b) Description of the Related Art

A silicon film doped with impurities is electrically conductive and can be used as a conductive member. Impurities may be doped, at the same time when a film is formed, or by ion implantation or diffusion after the film is formed.

Silicon films doped with impurities are used as gate electrodes of MOSFETs, parts of polycide (lamination of polycrystalline silicon and silicide) gate electrodes, capacitor electrodes of DRAMs, wirings, and parts of polycide wirings. The resistivity of a silicon film used as a conductive member is preferably made as low as possible.

The resistivity depends on the mobility of carriers and the carrier concentration. It is more preferable to use polycrystalline silicon than amorphous silicon in order to increase a carrier mobility. Although a higher mobility is obtained by using single crystal silicon, it is generally and practically difficult to form a single crystal silicon film on the surface of a substance other than silicon. A carrier concentration is generally proportional to a doped amount of impurities, and is limited by a solid solubility of an impurity element in silicon. Therefore, in order to form a silicon film having a low resistivity, a polycrystalline silicon film doped with impurities to a concentration near a solid solubility limit is formed.

Phosphorus is most used as n-type impurities of a silicon film and borons as p-type impurities. In a DRAM, a memory cell unit is formed by n-type MOSFETs and a peripheral circuit unit is formed by CMOS circuits of n- and p-channel MOSFETs. Phosphorus as n-type impurities is therefore most important.

SUMMARY OF THE INVENTION

As will be detailed later, it has been found that the resistivity of a silicon film doped with phosphorus to a concentration near a solid solubility limit becomes higher than a design value after completion of device manufacturing processes.

It is an object of the present invention to provide a method of manufacturing a semiconductor device having a silicon film having a sufficiently low resistivity after completion of device manufacturing processes.

According to one aspect of the present invention, there is provided a method of manufacturing a semiconductor device including the steps of depositing a silicon film on an underlying layer by doping phosphorus to a concentration of $7 \times 10^{20}$ to $2 \times 10^{21}$ atoms/cm$^3$, and thereafter heating the silicon film.

Phosphorus of $7 \times 10^{20}$ atoms/cm$^3$ greatly exceeds a solid solubility limit in silicon. However, even if phosphorus escapes from the silicon film at the later heat treatment, a sufficient amount of phosphorus is retained in the silicon film and a low resistivity is realized because phosphorus has initially excessively doped in the silicon film.

In this manner, it is possible to have a desired low resistivity of a silicon thin film of a semiconductor device after completion of manufacturing processes.

It is also possible for a capacitor using a silicon thin film to suppress a depletion width and reduce a capacitance change.

DETAILED DESCRIPTION OF THE PREFERRED EMBODIMENTS

As the degree of integration of semiconductor integrated circuit devices becomes high, the structure thereof tends to have many layers. In order to ensure a good coverage of a film formed by a method of manufacturing a semiconductor device having a multi-layer structure, the thickness of each layer of the device is desired to be as thin as possible. If the resistance of a silicon film having a thin pattern is desired to be low, a resistivity of silicon is required to be as low as possible.

It has been found that the resistivity of a thin silicon film used in a semiconductor device becomes higher than a design value after completion of device manufacturing processes. In order to study the causes of this phenomenon, the inventors made the following experiments.

Amorphous (a-) silicon thin films were formed while doping impurities at the same time. An oxide film was deposited at a low temperature on the surface of each amorphous silicon thin film so as to encapusulate doped impurities. Thereafter, the device was annealed at a temperature of 850° C. for 20 minutes in a N$_2$ atmosphere to transform the amorphous silicon into polycrystalline silicon, and then the oxide film was removed by HF aqueous solution. Thereafter, sheet resistances were measured. Each measured sheet resistance is usually used as standard design data.

In order to simulate a silicon film in an actual device, a structure corresponding to a fin type capacitor of a DRAM was formed by using an amorphous silicon film doped with phosphorus, subjected to a heat treatment similar to a DRAM manufacturing process, and thereafter the sheet resistance of the silicon film was measured. The results are shown in FIG. 1A.

Figure 1A:
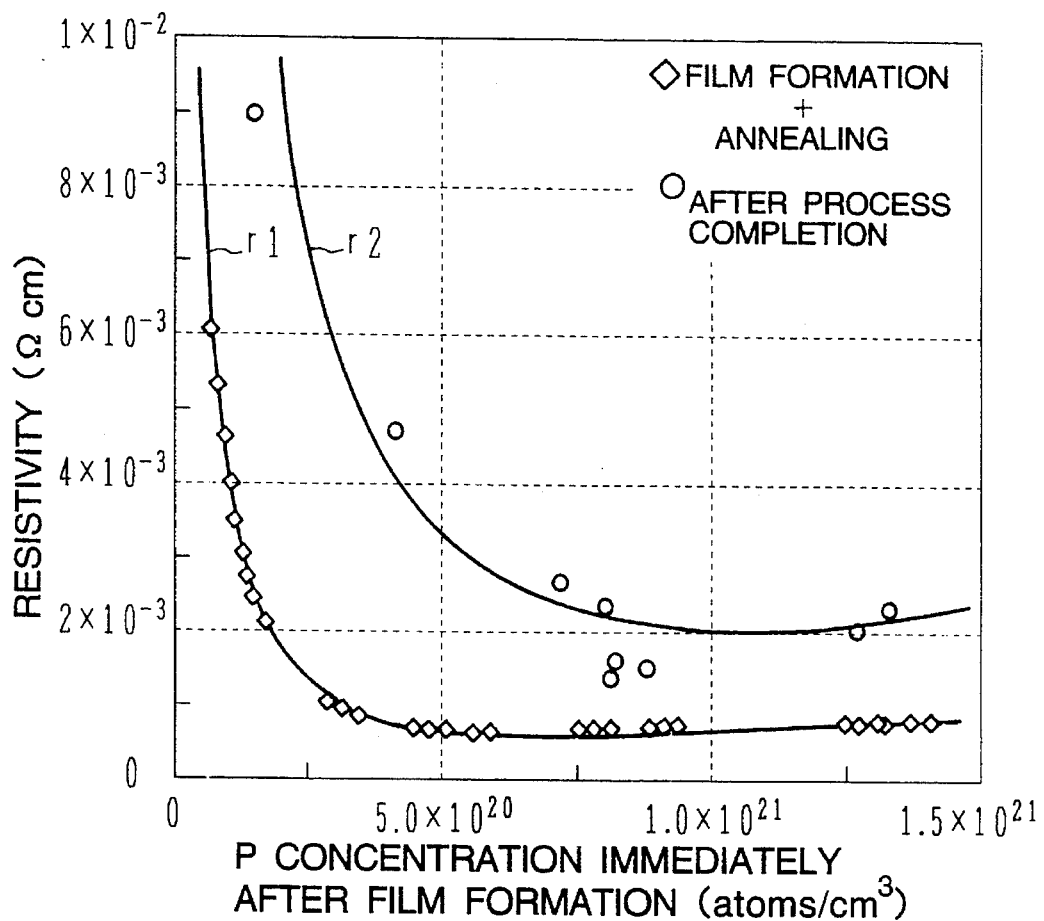
FIGS. 1A to 1C are a graph showing a resistivity of a silicon thin film doped with phosphorus as a function of a phosphorus concentration, and schematic cross sectional views showing the structures of samples.

In FIG. 1A, the abscissa represents a phosphorus concentration in a linear scale immediately after the film formation, and the ordinate represents a resistivity ($\Omega$cm) in a linear scale. A curve r1 represents resistivities of samples which have an amorphous silicon film doped with impurities, covered with an oxide film, and annealed at 850° C. for 20 minutes. A curve r2 represents resistivities of samples which have an amorphous silicon film doped with impurities, having a structure equivalent to a fin type capacitor electrode of a DRAM, and subjected to a heat treatment like a process which actual devices undergo.

Figure 1B:
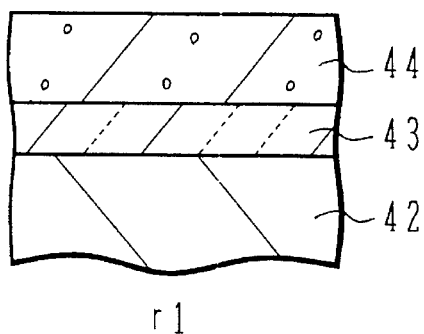
Figure 1C:
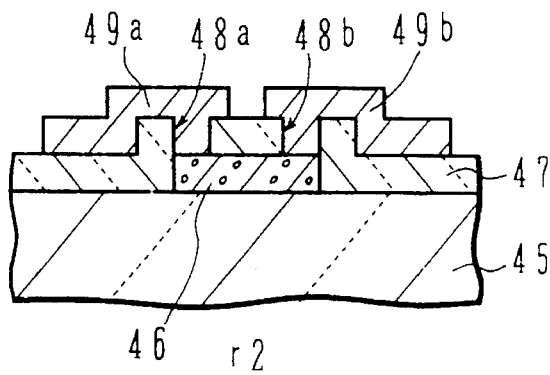

FIGS. 1B and 1C show the structures of samples used by the experiments. The structure of samples used for the measurement of the curve r1 is shown in FIG. 1B. A silicon oxide film 43 was formed on a silicon substrate 42, and an amorphous silicon film 44 was formed on the silicon oxide film 43. The surface of the amorphous silicon film 44 was covered with an oxide film, and the device was annealed (to change amorphous silicon to polycrystalline silicon). The surface oxide film was thereafter removed, again taking the structure shown in FIG. 1B. In this state, the resistance of the film 44 was measured by a four-probe method. FIG. 1C shows the main part of the structure of the sample used for the measurement of the curve r2. This structure is similar to a film 22 shown in FIG. 3L to be later described. An amorphous silicon pattern 46 was formed on a silicon oxide film region 45, and the surface of the pattern 46 was covered with a silicon oxide film 47. Contact holes 48a and 48b were formed in the silicon oxide film 47, and lead electrodes 49a and 49b were connected to the pattern 46.

The silicon film was formed at a substrate temperature of 500° C. by flowing disilane ($Si_2H_6$) at 50 sccm as a silicon source and by flowing a mixed gas of a $N_2$ gas and a gas of $N_2$ mixed with 2% phosphine ($PH_3$) at 270 sccm as a phosphorus source. The flow of disilane was maintained constant, and the total flow of $PH_3/N_2$ and $N_2$ was also maintained constant. A variety of phosphorus concentrations were prepared by changing the flow ratio of $PH_3/N_2$ gas to $N_2$ gas. The silicon film of the sample for the curve r1 has a large area with a thickness of about 1000 angstroms, and the resistivities were measured by four probes. The silicon film of the sample for the curve r2 has a thickness of about 50 nm and a stripe shape of 6.5 μm×65 μm.

As seen from FIG. 1A, the resistivities of the curve r2 are twice or higher than the resistivities of the curve r1. The resistivities of the curve r2 become five times or higher than those of the curve r1 particularly at the phosphorus concentration, near a phosphorus solid solubility limit in silicon of $3–4 \times 10^{20}$ atoms/$cm^3$.

It is preferable to select the phosphorus concentration by using the curve r2 in order to use a fin type capacitor and realize as low a resistivity as possible. In this case, the optimum phosphorus concentration is about $1.0 \times 10^{21}$ atoms/$cm^3$, and it is preferable to select the concentration in the range from $7 \times 10^{20}$ atoms/$cm^3$ to $2.0 \times 10^{21}$ atoms/$cm^3$.

The difference between resistivities may result from the following reasons. Phosphorus in a silicon thin film covered (at least partially covered) with another film diffuse to the other film by the heat treatment one the thin film, by later heat treatments, or by out-diffusion while the other film is formed. The phosphorus concentration immediately after the film formation therefore gradually lowers, and the phosphorus concentration after the completion of device manufacturing processes greatly deviates from that immediately after the film formation.

The reason why the minimum value of the resistivities of the curve r2 is far higher than the minimum value of the resistivities of the curve r1 is assumed to result from a film thickness difference between samples, a crystal property difference between polycrystalline silicon changed from amorphous silicon by the heat treatment, and the like.

It is desired that a DRAM capacitor has a low resistivity for the electrode and a designed capacitance. If capacitor electrodes are made of silicon films and the impurity concentration is low, a depletion layer grows from the capacitor electrode surface when a reverse bias voltage is applied, and the distance between electrodes becomes large and hence the capacitance lowers.

Figure 2A:
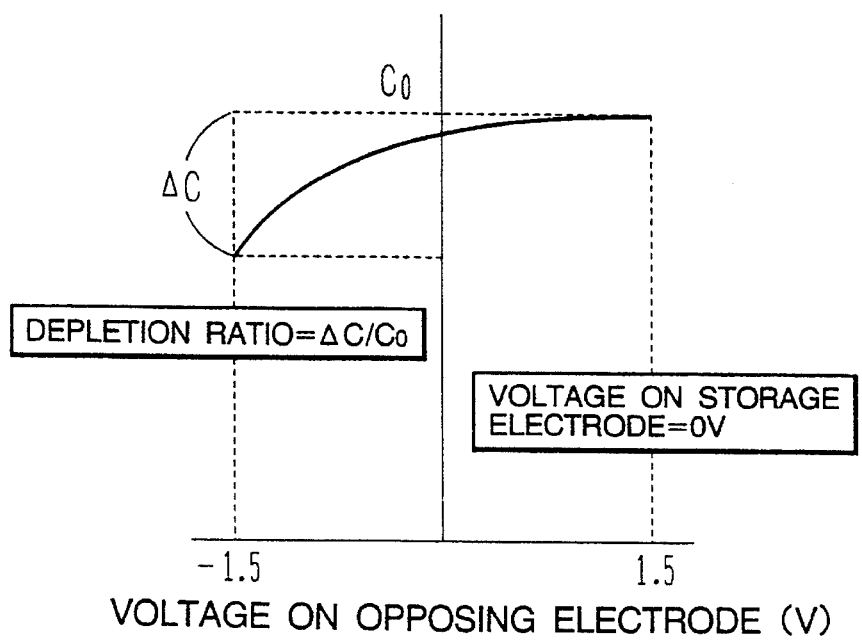
FIGS. 2A and 2B are a graph explaining a definition of a depletion ratio of a capacitor using a silicon thin film, and a graph showing a depletion ratio as a function of a phosphorus concentration immediately after the film is formed.

As shown in FIG. 2A, capacitances were measured by fixing a storage electrode to 0 V and changing a voltage at an opposing electrode from −1.5 V to 1.5 V. A depletion ratio is defined as $\Delta C/Co$ where Co is a capacitance at a forward bias of +1.5 V at the opposing electrode and $\Delta C$ is a capacitance reduction when the voltage at the opposing electrode is changed to a reverse bias of −1.5 V.

As a sample, a silicon nitride (SIN) film was formed on a silicon film to a thickness of 7 nm, and oxidized to form a silicon oxynitride film having a thickness of about 6 nm based on $SiO_2$ unit (calculated from a measured capacitance). An opposing electrode was formed on the silicon oxynitride film by doping phosphorus to a concentration of about $7 \times 10^{20}$ atoms/$cm^3$.

When a voltage of −1.5 V is applied to the opposing electrode, a reverse bias voltage is applied to the surface of the storage electrode and a depletion layer grows on the surface of the storage electrode. The width of the depletion layer becomes large as the impurity concentration of the silicon film of the storage electrode lowers.

Figure 2B:
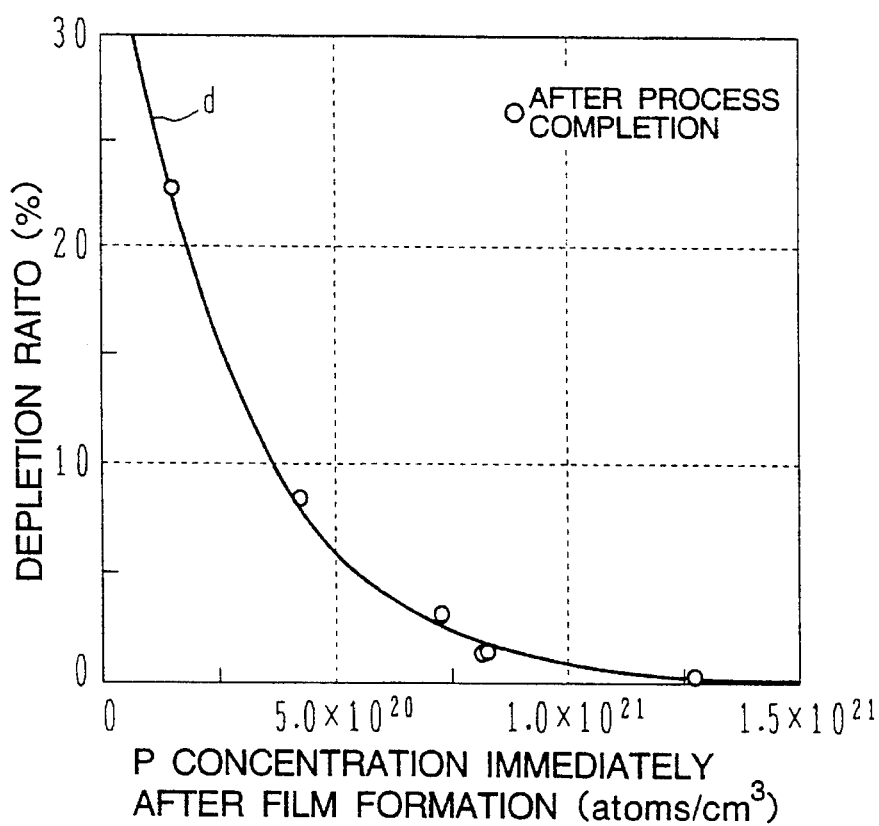

FIG. 2B is a graph showing a change in the depletion ratio as a function of a phosphorus concentration in the capacitor electrode immediately after the film formation. The abscissa represents the phosphorus concentration in atoms/$cm^3$ immediately after the film formation, and the ordinate represents the depletion ratio in %. The experiment sample is similar to a fin type capacitor shown in FIG. 1C.

The depletion ratio indicated by the curve d is about 10% at a phosphorus solid solubility limit of 3 to $4 \times 10^{20}$ atoms/$cm^3$. The depletion ratio lowers as the phosphorus concentration increases, and takes about 2 to 3% at about $7.0 \times 10^{20}$ atoms/$cm^3$ and a negligible value at $1.5 \times 10^{21}$ atoms/$cm^3$ or higher.

In order to have a constant value of a capacitor, therefore, a silicon film for a capacitor electrode is made to have at least a phosphorus concentration of $7.0 \times 10^{20}$ atoms/$cm^3$, and preferably a higher concentration. It is also preferable that the phosphorus concentration does not exceed $2 \times 10^{21}$ atoms/$cm^3$. Doping phosphorus in a silicon film to a concentration of at least $7.0 \times 10^{20}$ atoms/$cm^3$ corresponds to doping phosphorus about twice the phosphorus solid solubility limit immediately after the film formation.

The processes of manufacturing a DRAM will be described with reference to FIGS. 3A to 3L.

Figure 3A:
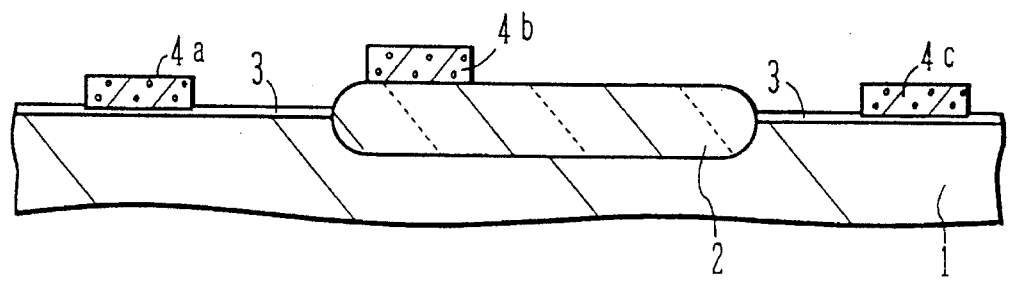
FIGS. 3A to 3L are schematic cross sectional views explaining a method of manufacturing a DRAM according to an embodiment of the invention.

As shown in FIG. 3A, on the surface of a $p^-$-type silicon substrate 1, a field oxide film 2 is formed to a thickness of about 400 nm by LOCOS oxidation by using a silicon nitride film as a mask. After LOCOS oxidation, the silicon nitride film is removed and a gate oxide film 3 is formed to a thickness of about 10 nm on the exposed silicon surface, for example, by dry oxidation at a temperature of about 1000° C.

A Si gate electrode layer 4 is formed to a thickness of about 200 nm over the gate oxide film 3 and field oxide film 2, by low pressure CVD at 0.2 Torr, at a substrate temperature of 500° C., by flowing $Si_2H_6$ at 50 sccm and flowing $2\%PH_3/N_2+ N_2$ at 270 sccm. A resist pattern is formed on the gate electrode layer and patterned to form gate electrodes 4a and 4c and wirings 4b. The gate length of the gate electrodes 4a and 4c is, for example, about 0.5 μm.

A MOSFET using the gate electrode 4c is a transistor of a peripheral circuit and it is formed in a peripheral circuit region of a DRAM. A MOSFET using the gate electrode 4a shown in the left side of FIG. 3B and the wiring 4b are formed in a memory cell region of DRAM. In FIGS. 3A to 3L, they are shown at adjacent areas for simplifying the drawings.

Figure 3B:
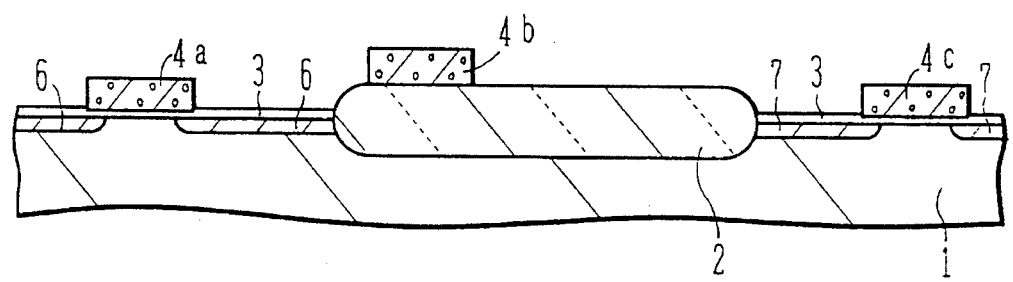

Next, as shown in FIG. 3B, by using the gate electrodes 4a and 4b as a mask, phosphorus ions are implanted at an acceleration energy of 20 keV and a dose of $10^{13}$ cm$^{-2}$ to form n-type regions 6 and 7 which are source/drain regions of MOSFET in the memory region and low impurity concentration regions of an LDD structure of MOSFET in the peripheral circuit region.

Figure 3C:
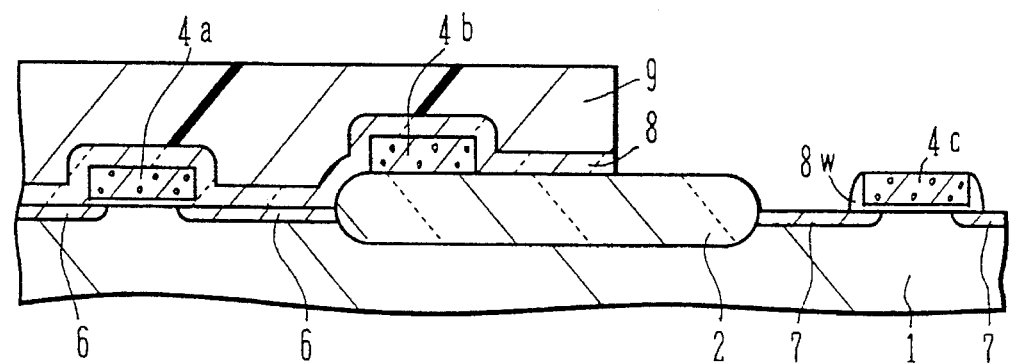

As shown in FIG. 3C, a high temperature oxide (HTO) film 8 is formed over the substrate surface to a thickness of about 100 nm by CVD at a substrate temperature of about 800° C. by using SiH$_4$+ N$_2$O. Next, a resist mask 9 is formed on the substrate surface to cover the memory region. By using the resist mask 9 as an etching mask, the HTO film 8 is etched vertically by reactive ion etching. The HTO film 8 formed on a flat plane in the peripheral circuit area is removed, and the HTO film 8 formed on the sides of the gate electrode 4c is left unetched to form side walls 8w. Thereafter, the resist mask 9 is removed.

Figure 3D:
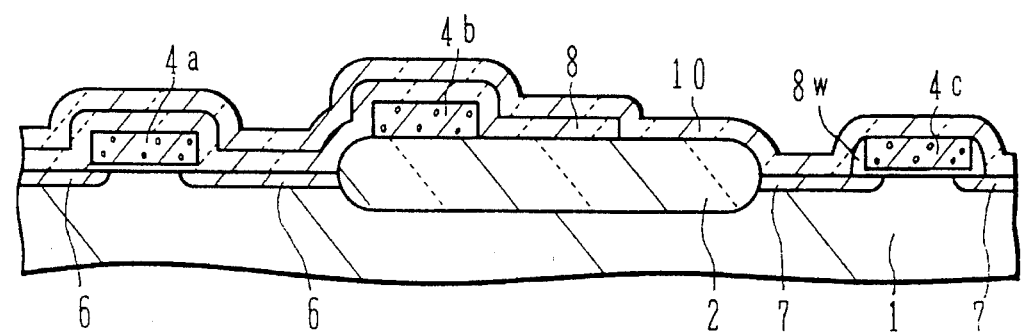

As shown in FIG. 3D, another HTO film 10 is deposited to a thickness of about 100 nm by a similar process.

Figure 3E:
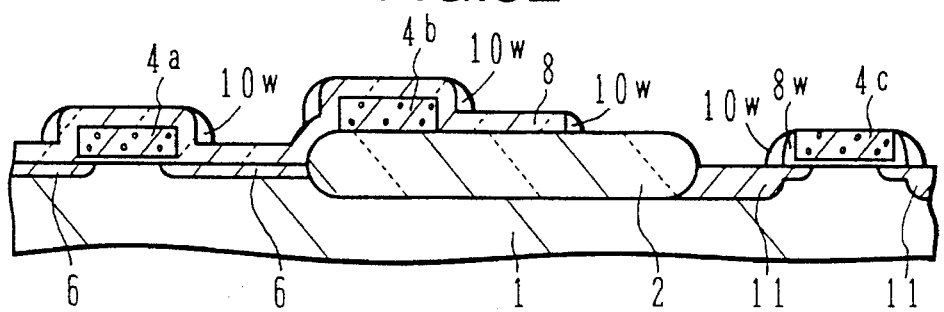

As shown in FIG. 3E, the HTO film 10 is subjected to reactive ion etching to remove the HTO film on the flat plane and leave the HTO film at stepped portions to form side walls 10w.

By using the high temperature oxide film, side walls, and gate electrodes as a mask. Phosphorus ions are implanted at an acceleration energy of 20 keV and a dose of $10^{15}$cm$^{-2}$ to form n$^+$-type regions 11 which are source/drain regions of a peripheral circuit transistor.

Figure 3F:
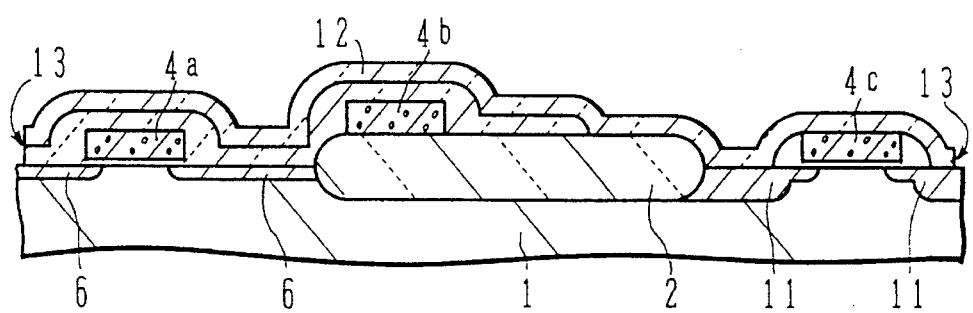

As shown in FIG. 3F, another HTO film 12 is formed to a thickness of about 100 nm by a similar process. Thereafter, a resist mask is formed on the HTO film 12, and openings 13 are formed at contact regions of MOSFETs. The size of the opening is, for example, 0.5 μm square.

Figure 3G:
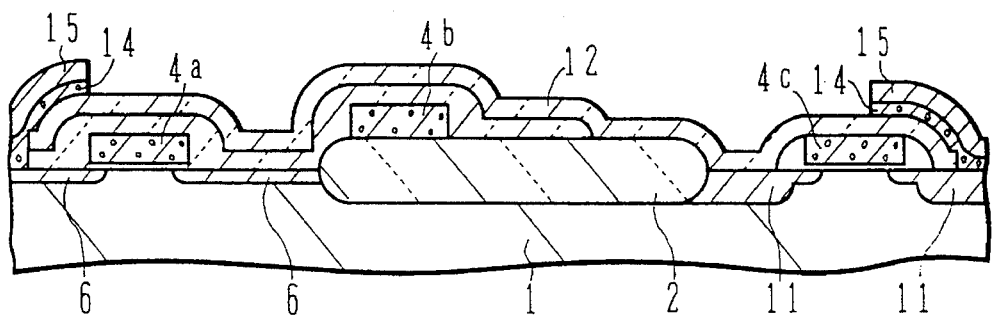

As shown in FIG. 3G, an amorphous silicon layer 14 having a thickness of about 50 nm and a WSi$_x$ layer 15 having a thickness of about 100 nm are deposited by low pressure CVD in this order over the substrate surface while embedding the silicon surface exposed in the openings 13.

A resist mask is formed thereafter on the surface. Etching is done to pattern the amorphous silicon layer 14 and WSi$_x$ layer 15 to form polycide electrodes. Depositing the amorphous silicon layer 14 may be performed by a similar process of depositing the amorphous silicon layer shown in FIG. 3A.

Figure 3H:
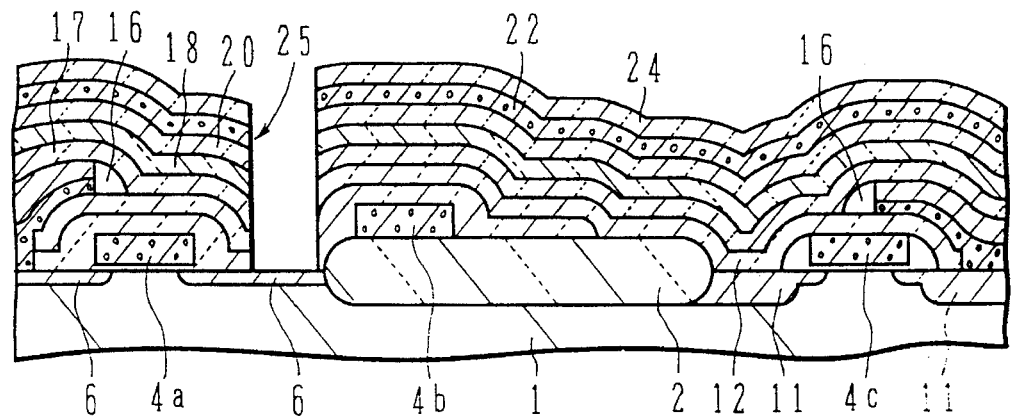

As shown in FIG. 3H, another HTO film 16 is deposited and the HTO film on a flat plane is removed by RIE to form side walls 16 on the sides of the electrodes. Another HTO film 17 is deposited to a thickness of about 100 nm. Depositing these HTO films may be performed at a substrate temperature of 800° C. like the HTO films 8, 10, and 12.

An SiN$_x$ film 18 is formed on the HTO film 17 to a thickness of about 50 nm at a substrate temperature of 775° C., An HTO film 20 is deposited to a thickness of about 50 nm at a substrate temperature of 800° C.

Next, an amorphous silicon layer 22 doped with phosphorus to a concentration of $7\times10^{20}$ atoms/cm$^3$ or more is deposited to a thickness of about 50 nm at a substrate temperature of 500° C. under the conditions of a pressure of 0.2 Torr, a flow of Si$_2$H$_6$ at 50 sccm, a flow of 2%PH$_3$/N$_2$ at 110 sccm, and a flow of N$_2$ at 160 sccm.

Next, an HTO Film 24 is deposited to a thickness of about 50 nm at a substrate temperature of 800° C. After these depositing processes are completed, a resist mask is formed on the substrate surface, and an opening 25 of about a 0.5 μm square reaching one of the source/drain regions 6 of MOSFET in the memory region is formed. Thereafter, the resist is removed.

Figure 3I:
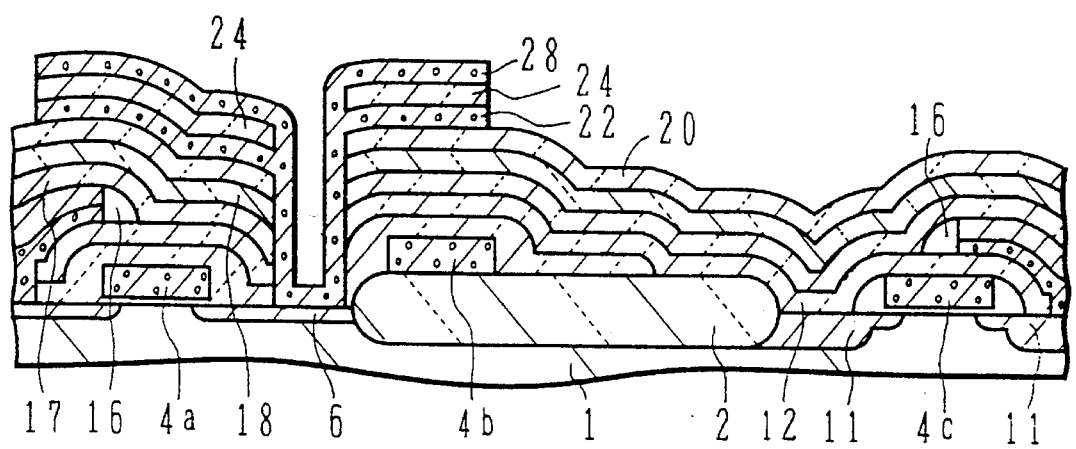

As shown in FIG. 3I, an amorphous silicon layer 28 doped with phosphorus to a concentration of $7\times10^{20}$ atoms/cm$^3$ or more is deposited to a thickness of about 50 nm on the surface of the HTO film 24 under the same conditions of the amorphous silicon layer 22 shown in FIG. 3H (at a substrate temperature of 500° C., of a pressure of 0.2 Torr, a flow of Si$_2$H$_6$ at 50 sccm, a flow of 2%PH$_3$/N$_2$ at 110 sccm, and a flow of N$_2$ at 160 sccm).

Next, annealing is performed at a temperature of about 800° C. in a N$_2$ atmosphere to transform the amorphous silicon layers 22 and 28 to polycrystalline silicon. The amorphous silicon layers 4 and 14 formed earlier are also transformed to polycrystalline silicon by this annealing process or later heat treatments.

A resist mask is thereafter formed on the substrate surface and the amorphous silicon layers 28 and 22 and HTO film 24 therebetween are patterned by RIE. In this manner, a storage electrode of a capacitor of a DRAM memory cell is formed.

Figure 3J:
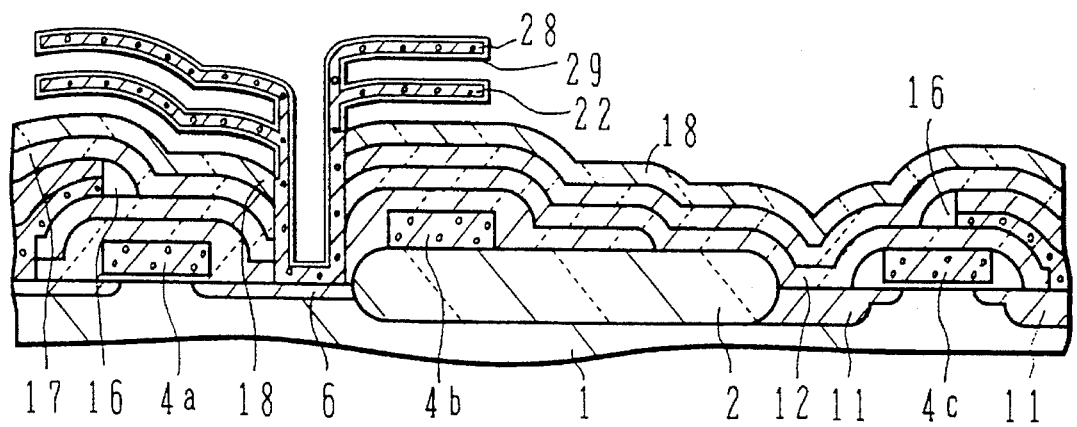

As shown in FIG. 3J, the substrate is immersed in HF aqueous solution to remove the HTO films 20 and 24 exposed on the substrate surface. As the HTO films 20 and 24 are removed, the hidden fin surfaces are exposed.

An SiN$_x$ film 29 is formed to a thickness of about 6 nm by low pressure CVD at a substrate temperature of 725° C. The exposed fin surfaces are covered with the SiN$_x$ film 29. Next, the surface of the SiN$_x$ film 29 is oxidized at a substrate temperature of about 800° C. in a wet oxidation atmosphere. In this manner, a capacitor insulating film 29 is formed.

Figure 3K:
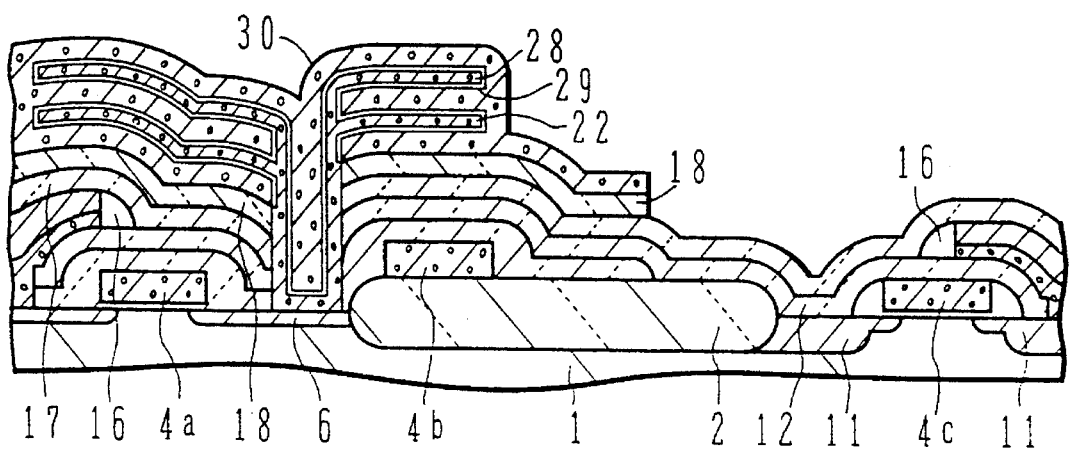

As shown in FIG. 3K, by a similar process of depositing the amorphous silicon layers shown in FIGS. 3H and 3I, an amorphous silicon layer 30 doped with phosphorus impurities to a concentration of $7.0\times10^{20}$ to $1.2\times10^{21}$ atoms/cm$^3$ is deposited to a thickness of, for example, 100 nm to bury the gap between fins and cover the whole surface of the fins.

A resist mask is formed on the deposited amorphous silicon layer 30 to pattern the amorphous silicon layer 30 and underlying SiN$_x$ layer 18. Thereafter, the resist mask is removed.

Figure 3L:
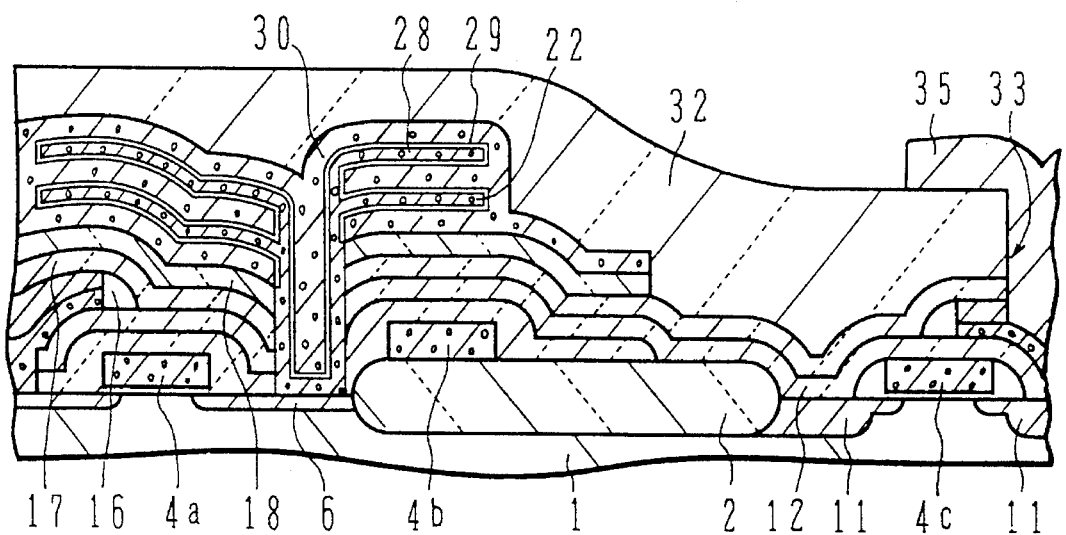

As shown in FIG. 3L, an HTO film is deposited to a thickness of about 50 nm at a substrate temperature of 800° C. and then a BPSG (boron phosphorous silicate glass) layer 32 is deposited to a thickness of about 400 nm. Then, the substrate is heated to about 850° C. to melt the BPSG layer 32 and flatten or planarize the surface thereof.

A resist mask is formed on the flattened BPSG layer 32, and an opening 33 is formed by RIE at the electrode lead-out region of MOSFET in the peripheral circuit unit by RIE. Thereafter, an Al electrode layer is deposited and patterned to form an Al wiring 35. With the above processes, a DRAM device is manufactured.

In the above description, phosphorus is doped in the silicon electrode of a DRAM capacitor to a concentration ($7\times10^{20}$ atoms/cm$^3$ or more)twice or higher than the phosphorus solid solubility limit. The concentration of doped phosphorus is preferably selected by taking into consideration a thickness of a silicon film to be deposited, and later heat treatments. Phosphorus twice or higher than the solid solubility limit may be doped when the silicon layer 4 of the gate electrode and the underlying silicon layer 14 of the polycide electrodes are formed.

In forming an electrode of polycrystalline silicon or amorphous silicon, it is preferable to set the initial phosphorus concentration of the silicon layer to $7.0 \times 10^{20}$ to $1.0 \times 10^{21}$ atoms/cm$^3$.

In the case of a polycide electrode formed by a lamination of a polycrystalline silicon layer and a silicide layer, it is preferable to set the initial phosphorus concentration to $1.0 \times 10^{21}$ to $2.0 \times 10^{21}$ atoms/cm$^3$ because phosphorus in the silicide layer such as tungsten silicide (WSi) is likely to escape and moves away from the layer.

In forming a storage electrode of a capacitor, it is preferable to set the initial phosphorus concentration to $1.2 \times 10^{21}$ to $1.6 \times 10^{21}$ atoms/cm$^3$ because the effect of depletion upon a device performance is large and phosphorus escapes (moves away) during the formation of an HTO film or annealing.

In forming an opposing electrode of a capacitor, it is preferable to set the initial phosphorus concentration to $7.0 \times 10^{20}$ to $1.2 \times 10^{21}$ atoms/cm$^3$ because the effect of depletion upon a device performance is large although a film thickness is relatively large.

The present invention has been described in connection with the preferred embodiments. The invention is not limited only to the above embodiments. For example, instead of disilane, other silicon sources such as monosilane may be used although a deposition speed lowers. Instead of an HTO film, any other insulating film may be used. The invention is applicable not only to DRAM devices but also to other semiconductor devices using conductive silicon films. It is apparent to those skilled in the art that various modifications, improvements, combinations and the like can be made without departing from the scope of the appended claims.

I claim:

1. A method of manufacturing a semiconductor device comprising the steps of:

depositing a film of amorphous silicon on an underlying layer from a gas stream containing a silane and a phosphine, said film being doped with phosphorus to a concentration of $7 \times 10^{20}$ to $2 \times 10^{21}$ atoms/cm$^3$; and then heating said film to convert the amorphous silicon in the film to polycrystalline silicon.

2. A method according to claim 1, wherein said heating step includes a step of depositing an insulating film on said amorphous silicon film.

3. A method according to claim 1, wherein said heating step includes a step of depositing a silicide film on said amorphous silicon film.

4. A method according to claim 1, wherein said film of amorphous silicon is deposited by chemical vapor deposition from a gas stream containing disilane and phosphine.

5. A method according to claim 2, wherein said underlying layer is a gate oxide film formed on a silicon substrate, and the method further comprises the step of patterning said amorphous silicon film and forming a gate electrode.

6. A method according to claim 2, wherein said underlying layer is formed on a silicon substrate and has a laminated layer structure with an interlayer insulating film as the uppermost layer and a contact hole exposing the surface of the silicon substrate.

7. A method according to claim 6, further comprising the step of depositing a silicon film on said interlayer insulating film, said silicon film being doped with phosphorus to a concentration of $7 \times 10^{20}$ to $2 \times 10^{21}$ atoms/cm$^3$.

8. A method according to claim 3, wherein said underlying layer is an interlayer insulating film formed over a semiconductor substrate, and the method further comprises the step of patterning said silicide film and said amorphous silicon film to form a wiring pattern.

9. A method according to claim 1, wherein said silicon film forms a polycrystalline or amorphous silicon electrode, and said phosphorus concentration is set to $7.0 \times 10^{20}$ to $1.0 \times 10^{21}$ atoms/cm$^3$.

10. A method according to claim 1, wherein said silicon film forms a part of a polycide electrode, and said phosphorus concentration is set to $1.0 \times 10^{21}$ to $2.0 \times 10^{21}$ atoms/cm$^3$.

11. A method according to claim 1, wherein said silicon film is used for a storage electrode of a capacitor, and said phosphorus concentration is set to $1.2 \times 10^{21}$ to $1.6 \times 10^{21}$ atoms/cm$^3$.

12. A method according to claim 1, wherein said silicon film is used for an opposing electrode of a capacitor, and said phosphorus concentration is set to $7.0 \times 10^{20}$ to $1.2 \times 10^{21}$ atoms/cm$^3$.

* * * * *